US007242225B2

(12) United States Patent
Klage

(10) Patent No.: US 7,242,225 B2
(45) Date of Patent: Jul. 10, 2007

(54) DIRECT DIGITAL FREQUENCY SYNTHESIZER

(75) Inventor: Günther Klage, Zorneding (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 10/549,940

(22) PCT Filed: Oct. 21, 2004

(86) PCT No.: PCT/EP2004/011932

§ 371 (c)(1),
(2), (4) Date: Sep. 20, 2005

(87) PCT Pub. No.: WO2005/048089

PCT Pub. Date: May 26, 2005

(65) Prior Publication Data

US 2006/0186930 A1 Aug. 24, 2006

(30) Foreign Application Priority Data

Nov. 5, 2003 (DE) ................. 103 51 604

(51) Int. Cl.
G06F 1/02 (2006.01)
(52) U.S. Cl. ................. 327/106; 708/271; 327/107
(58) Field of Classification Search ........ 327/105–107, 327/113; 708/271, 272, 276
See application file for complete search history.

(56) References Cited

U.S. PATENT DOCUMENTS 4,901,265 A   2/1990  Kerr et al.
5,014,231 A * 5/1991  Reinhardt et al. .......... 708/271
5,184,093 A * 2/1993  Itoh et al. .................. 331/25
5,563,535 A * 10/1996 Corry et al. ................ 327/105
5,931,891 A * 8/1999  Landry ....................... 708/271

(Continued)

FOREIGN PATENT DOCUMENTS

EP   0 469 233 A2   2/1992

(Continued)

OTHER PUBLICATIONS

Leyonhjelm et al., Wireless Personal Communications, Kluwer Academic Publishers, NL, vol. 8, No. 1, Aug. 1998, pp. 31-35.

(Continued)

Primary Examiner—Dinh T. Le
(74) Attorney, Agent, or Firm—Birch, Stewart, Kolasch & Birch, LLP

(57) ABSTRACT

A frequency synthesizer according to the direct digital synthesis method is provided. The frequency synthesizer includes a phase accumulator for the cyclical incrementation of a phase signal by a phase increment M present at the input of the phase accumulator, a memory unit with a table of sine-function values stored in its memory cells for the determination of sine-function values corresponding to phase values of the phase signal, a digital-to-analog converter for the conversion of time-discrete sine-function values into a quasi-analog sinusoidal time function and an anti-aliasing low-pass filter for smoothing the quasi-analog sinusoidal time function. The frequency synthesizer additionally contains an adder, which is connected between the memory unit and the digital-to-analog converter and which superimposes a non-periodic signal over the time-discrete sine-function values.

12 Claims, 6 Drawing Sheets

U.S. PATENT DOCUMENTS

| | | | |
|---|---|---|---|
| 6,262,604 B1 | 7/2001 | Gabet et al. | |
| 6,333,649 B1 * | 12/2001 | Dick et al. | 327/105 |
| 2002/0057733 A1 | 5/2002 | Sullivan | |
| 2003/0118143 A1 | 6/2003 | Bellaouar et al. | |
| 2005/0123078 A1 * | 6/2005 | Felbach | 375/344 |

FOREIGN PATENT DOCUMENTS

| | | |
|---|---|---|
| EP | 0 823 700 A | 2/1998 |
| WO | WO-03/044959 A | 5/2003 |

OTHER PUBLICATIONS

Reinhardt et al., Proceedings of the Annual Frequency Control Symposium, Philadelphia, Pennsylvania, New York, IEEE, vol. Symp. 40, May 28, 1986, pp. 355-365.

Papay, "Numerical distortion in single-tone DDS", IEEE Instrumentations and Measurement, Technology Conference, Budapest, Hungary, May 21-23, 2001, pages.

* cited by examiner

DIRECT DIGITAL FREQUENCY SYNTHESIZER

BACKGROUND OF THE INVENTION

1. Field of the Invention

The invention relates to a frequency synthesiser according to the direct digital synthesis method with the capability of suppressing secondary lines in the frequency spectrum of the output frequency signal.

2. Description of the Background Art

Contemporary high-resolution broadband frequency synthesisers are essentially based upon two different methods, the fractional-N-method and the direct digital synthesis method.

In the case of the fractional-N-method, the frequency is adjusted through defined frequency division of the reference frequency in a forward branch disposed upstream of the phase-locking loop or of the output frequency of the phase-locking loop in the closed-loop branch of the phase-locking loop, in each case via one programmable frequency divider. The frequency divider operates digitally via sigma-delta modulation of a digital word acting as a reference frequency value. A high-frequency phase-locking loop can be realized through the use of high division factors in the frequency divider of the closed-loop branch. However, high division factors bring about a significant increase in the phase noise of the phase-locking loop (phase noise of the phase-locking loop=20*log (division factor of the output frequency divider)). Moreover, the sigma-delta modulator generates a quantization noise increasing further away from the carrier, which must absolutely be suppressed by the PLL. The attenuation of the increased phase noise and/or of the increasing quantization noise by means of low-pass characteristics of the phase-locking loop is purchased at the cost of poorer control dynamics of the phase-locking loop (longer transient recovery time because of reduced bandwidth of the phase-locking loop). The maximum realisable control bandwidths, according to the existing prior art are around a few KHz. The fractional-N-method also provides a comparatively poor transient recovery performance, because the algorithm of the fractional-N-method approaches the optimum in an integrating manner. A final disadvantage of the fractional-N-method is that the frequency spectrum of the output frequency contains secondary lines, which occur during the division of the output frequency signal through the fractional-N-frequency divider in the closed-loop branch of the phase-locking loop with a division factor close to a whole-number division factor (so-called "fractional-N-secondary lines").

One advantage of the phase-locking loop is the fact that it can be realized in a comparatively cost-favorable manner and is therefore used primarily in applications in the low-price segment. The method of direct digital frequency synthesis does not suffer from the disadvantages mentioned above and is therefore used primarily in frequency synthesisers with rapid transient recovery and low-phase-noise.

A frequency synthesiser based on the method of direct digital synthesis according to document EP 0 469 233 A2 consists of a phase accumulator, which increments the phase of a phase signal cyclically at the clock pulse of a reference frequency by phase increments, which can be adjusted in a frequency word at the input of the phase accumulator. A memory unit downstream of the phase accumulator with a stored table of sine-function values supplies the sine-function values associated with the relevant phase values of the cyclical phase signal to a digital-to-analog converter at the clock pulse of the reference frequency as a time-discrete functional sequence. Smoothing through an anti-aliasing low-pass filter to the desired sinusoidal frequency signal takes place after the digital-to-analog converter.

The disadvantage with direct digital frequency synthesisers is the occurrence of secondary lines very close to the carrier in the frequency spectrum. If the lines appear close to the useful signal, these secondary lines cannot be regulated out of the frequency spectrum by a series-connected phase-locking loop with optimised bandwidth. The following reasons can be given for the occurrence of secondary lines of this kind in the frequency spectrum of the output frequency, also with reference to the specialist article: Papay, "Numerical Distortion in Single-Tone DDS", IEEE-Instrumentation and Measurement Technology Conference, Budapest, May 21–23, 2001:

Secondary lines caused by restricted phase resolution of the phase signal in the sine table of the memory unit:

As a result of limited memory capacity of the memory unit, all the bits of the phase signal are not used in addressing the memory cells containing the sine table. As a result of a restriction to the higher-value bits of the phase signal, the number of phase interpolation points used per sinusoidal oscillation is significantly reduced corresponding to a lower resolution of the phase interpolation points. This leads to a sawtooth phase error between the optimum phase interpolation points realisable, for example, with a 32 bit-wide phase-signal data word and the phase interpolation points actually used. This periodicity in the phase error, which corresponds to a phase modulation, leads to discrete secondary lines around the carrier frequency in the frequency spectrum of the output frequency generated.

Secondary lines caused by excessively low-amplitude resolution of the digital-to-analog converter:

The quantization of the time-discrete sine-function values for a predetermined phase value causes an amplitude error, which is dependent upon the resolution of the quantization (number of bits for the quantization of the amplitude value). Through this quantization of the amplitude value, an amplitude error of $\Delta A = 1/(2^{-A} * \sqrt{12})$ is caused, under the assumption that rounding errors are distributed uniformly in the range $\pm\frac{1}{2}$ LSB (A=number of bits of the D/A converter). If the length of the phase accumulator is a whole-number multiple of the frequency word, then the phase values are repeated periodically and the quantization error associated with each phase and amplitude value provides a periodic characteristic, which leads to higher value harmonics (=secondary lines) in the frequency spectrum. In the absence of periodicity of the phase values and therefore of the amplitude values in the case of a non-whole-number ratio between frequency word and the length of the frequency accumulator, interference lines can occur throughout the frequency spectrum instead of the higher value harmonics.

Secondary lines caused by nonlinearities in the transmission characteristic of the digital-to-analog converter:

As shown in FIG. 1, the transmission characteristic of a digital-to-analog converter generally provides a nonlinearity in the curve by comparison with an ideal-linear characteristic. This is strongly exaggerated in the presentation in FIG. 1. This may be a nonlinearity, which extends over the entire level range (a so-called integral nonlinearity) or only a deviation from the theoretical value difference for the transition between two conditions of the analog-to-digital converter (so-called differential nonlinearity). These nonlinearities are attributable to asymmetries in the internal structure of the digital-to-analog converter (e.g. asymmetries in difference amplification, power sources, resistance chains etc.).

In the case of harmonic excitation, nonlinearities in the transmission behaviour lead to the generation of harmonic waves, which, once again, lead to secondary lines in the frequency spectrum of the output frequency. Because the system involved is a sampled system, aliasing can occur. As shown in FIG. 2, these aliasing effects mean that harmonic secondary lines above the first Nyquist zone can be folded into corresponding non-harmonic secondary lines within the first Nyquist zone. It is problematic that non-harmonic secondary lines of this kind in the first Nyquist zone can come to be disposed very close to the carrier frequency. While harmonic secondary lines can be removed by means of low-pass filtering, this is not a viable possibility with non-harmonic secondary lines close to the carrier.

Secondary lines caused by the non-ideal dynamic behaviour of the digital-to-analog converter:

From a certain sampling frequency, dynamic effects become more prominent, by comparison with the static effects described in the previous paragraph, in the transmission behaviour of the digital-to-analog converter. This relates primarily to differences in rise and fall times and differences in overshooting in the case of transmission behaviour with multiple delays in the phase of sampling and holding of the time-discrete sinusoidal interpolation points ("glitches"). These dynamic interference effects are attributable to asymmetries and error adaptations in the internal structure of the digital-to-analog converter (e.g. error-adapted RC-elements, different switching times and the absence of synchronicity of individual logic units etc.). Since these dynamic interference effects occur periodically, undesired harmonics (=secondary lines), which are dominant from a given frequency by comparison with the secondary lines caused for the previously named reasons, also occur in the frequency spectrum. A minimisation of these dynamic irregularities through an additional sampling and holding while exploiting the resulting smoothing effect is not possible especially at higher sampling frequencies, because the sampling period can then become smaller than the transient recovery time.

The occurrence of secondary lines resulting from restricted phase and amplitude resolution is nowadays largely manageable. While an increased phase resolution, can be realized, for example, using advanced interpolation algorithms, an increased amplitude resolution no longer represents a substantial problem with contemporary digital-to-analog converters with 14 bit data-word width even in the upper clock-pulse frequency range of 100 MHz and above. Secondary lines caused by nonlinearities in the transmission characteristic and caused by dynamic asymmetries of the digital-to-analog converter, however, still present an unresolved problem with contemporary direct digital frequency synthesisers.

SUMMARY OF THE INVENTION

The present invention is therefore based upon the object of further developing the frequency synthesiser according to the direct digital synthesis method with the features according to the preamble of claim 1 in such a manner that secondary lines in the frequency spectrum can as far as possible be attenuated by comparison with the signal level of the carrier over as wide an output frequency range as possible.

The object of the invention is achieved with a frequency synthesiser according to the direct digital synthesis method with the characterising features of claim 1.

The secondary lines in the frequency response of the frequency synthesiser present higher-value harmonic components in the output frequency signal. To remove or at least to attenuate these secondary lines, it is therefore necessary to resolve these higher-frequency periodicities in the output frequency signal. The simplest method of generating a non-periodic signal from a signal with periodic signal components is to superimpose a non-periodic signal. A non-periodic signal provides a stochastic signal characteristic. A noise signal has a signal characteristic of this kind. In the frequency synthesiser according to the invention, a noise signal is therefore superimposed over the time-discrete sine-function values before the digital-to-analog converter, thereby significantly reducing the secondary lines in the useful frequency band of the frequency signal by comparison with the signal level of the carrier. This method can be realized by the frequency synthesiser according to the invention over a very wide frequency range.

Advantageous embodiments of the invention are indicated in the dependent claims.

Several requirements are placed on the frequency spectrum of the noise signal. On the one hand, the aim should be the largest possible signal-noise margin in the frequency range of the useful signal band, which can theoretically extend up to the Nyquist threshold. The frequency synthesiser according to the invention attenuates the noise in the useful signal band—frequency range, for example, between approximately 16 and 28 MHz with a clock-pulse frequency of 100 MHz—comparatively uniformly. It should additionally be ensured that the direct component and the lowest frequency ranges of the frequency spectrum of the noise signal disappear as far as possible, because otherwise, secondary lines in the frequency spectrum occur in the digital-to-analog conversion through intermodulation of the lowest-frequency noise components with the carrier, which are disposed very close to the carrier frequency. These lead to an unnecessary additional impairment of the signal-noise margin in the useful band. Finally, a frequency spectrum should be achieved, which is as far as possible noise-free in the high and highest frequency range. All of these requirements on the frequency spectrum of the noise signal are realized by a bandpass filtering of the white-noise signal in the low-frequency range below the useful signal band by means of a series connection of two non-recursive filters and a differentiator.

To generate a white-noise signal, which is as near as possible to the ideal, a noise generator consisting of two parallel-connected pseudo-noise generators with a combinatorial logic unit for linking the two pseudo-noise generator noise signals is used. In this manner, the periodicity of a pseudo-noise generator noise signal is increased by a large factor.

A phase-locking loop downstream of the direct digital frequency synthesiser ensures a conversion of the reference frequency generated by the frequency synthesiser—in the frequency range, for example, between 16 and 28 MHz—into the high frequency range of, for example, 900 MHz to 1.8 GHz. Because of its low-pass characteristic, the phase-locking loop ensures an additional attenuation of the spectral components, which are disposed further away from the frequency signal and have not been completely removed by the anti-aliasing low-pass filter following the digital-to-analog conversion.

BRIEF DESCRIPTION OF THE DRAWINGS

The attached drawings illustrate an exemplary embodiment of the invention, which is described in greater detail below. The drawings are as follows.

DETAILED DESCRIPTION OF THE PREFERRED EMBODIMENTS

Figure 1:
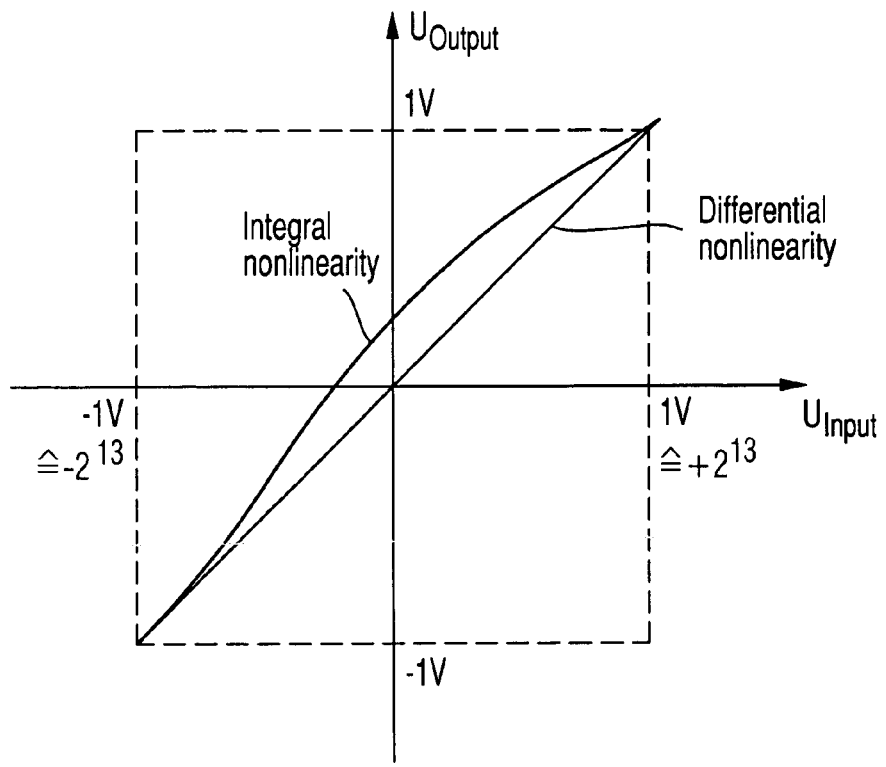
FIG. 1 shows a graphic representation of an ideal and real transmission characteristic of a digital-to-analog converter.
Figure 2:
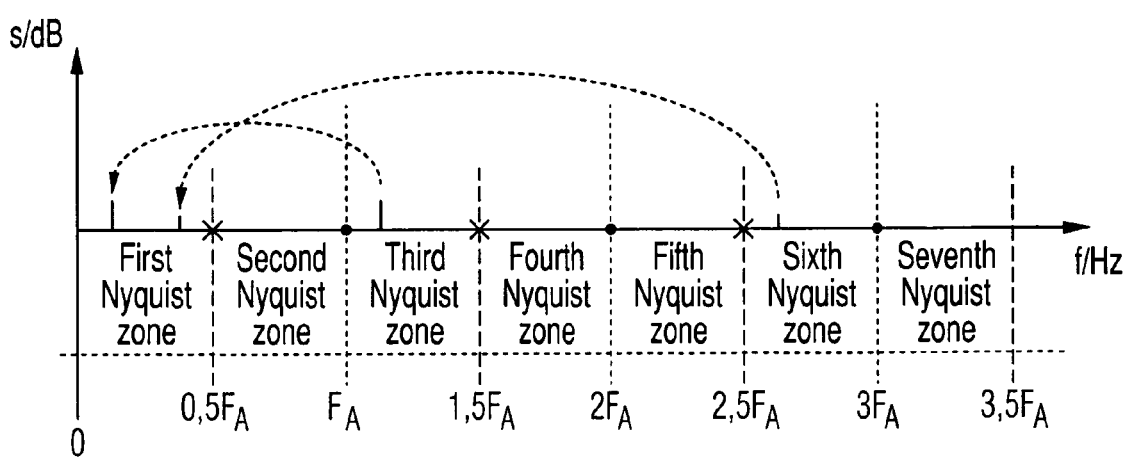
FIG. 2 shows a graphic representation of a frequency spectrum of a sampled system with aliasing effects.
Figure 3:
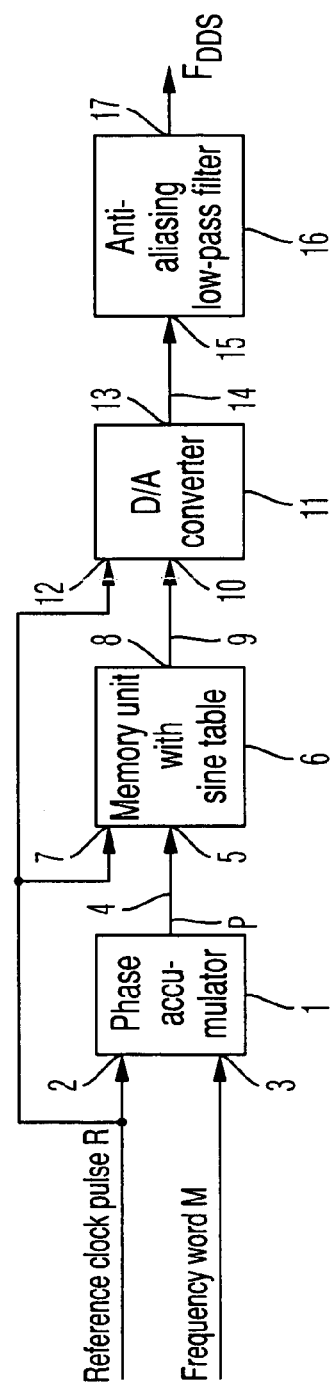
FIG. 3 shows a circuit diagram of a direct digital frequency synthesiser according to the prior art.

The direct digital frequency synthesiser according to the invention is described in detail below with reference to an embodiment based on a direct digital frequency synthesiser according to the prior art as shown in FIG. 3 with reference to FIGS. 4, 5, 6 and 11.

The direct digital frequency synthesiser according to the prior art as shown in FIG. 3 comprises a phase accumulator 1, which is timed at its first input 2 with a reference clock pulse R. At the reference clock pulse R, the phase accumulator 1 increments its internal counter by one phase increment, which is specified in the frequency word M and supplied to it via its second input 3. The maximum level of the internal counter is determined by its bit number NB and has the value $2^{NB-1}$. When the maximum level $2^{NB-1}$ of the internal counter is reached through the process of phase incrementation, the internal counter starts to increment from the beginning again and a cyclical incrementation process is continued with the specified phase increment. Accordingly, through the phase accumulator 1, a time-discrete cyclical phase signal P is generated, which provides a frequency $f_0$ according to the equation (1):

$$f_0 = M * R / 2^{NB} \tag{1}$$

This time-discrete cyclical phase signal P of the phase accumulator 1 is supplied via the connecting line 4 to the first input of a memory unit 6, of which the memory cells contain a table with sine-function values. The complete current phase word or an excerpt of the current phase word of the time-discrete cyclical phase signal P is used as the address for the memory cell, in which the sine-function value associated with the phase is stored. After addressing the relevant memory cell of the memory unit 6, the sine-function value corresponding to the current phase is read out in a clock-pulse synchronous manner with the reference clock pulse R present at the second input 7 and output at the output 8. Accordingly, viewed over time, a sequence of time-discrete sine-function values is present at the output 8 of the memory unit 6.

This sequence of time-discrete sine-function values is supplied via the connecting line 9 to the first input 10 of a digital-to-analog converter 11. At the clock pulse of the reference clock pulse R, which is supplied to the digital-to-analog converter 11 via its input 12, the sequence of time-discrete sine-function values is converted into a "stair-step" quasi-analog sinusoidal time function in the interior of the digital-to-analog converter 11. This quasi-analog sinusoidal time function is output at the output 13 of the digital-to-analog converter 11 and supplied via the connecting line 14 to the input 15 of the anti-aliasing low-pass filter 16.

In the anti-aliasing low-pass filter 16, the "stair-step" sine-function signal generated by the digital-to-analog converter is band-limited according to the Nyquist criterion as shown in equation (2):

$$f_A \geq 2 * f_G \tag{2}$$

A smoothed sine-function signal is obtained at the output 17 of the anti-aliasing low-pass filter 16, in that the "stair-step" sine function signal at the input 15 of the anti-aliasing low-pass filter 16 is limited in its bandwidth to the threshold frequency $f_G$, which, according to the Nyquist criterion, must be smaller than half the sampling frequency $f_A$. This smoothed sine-function signal represents the output frequency signal $F_{DDS}$ generated by the direct digital frequency synthesiser, the frequency of which is derived from equation (1).

Figure 4:
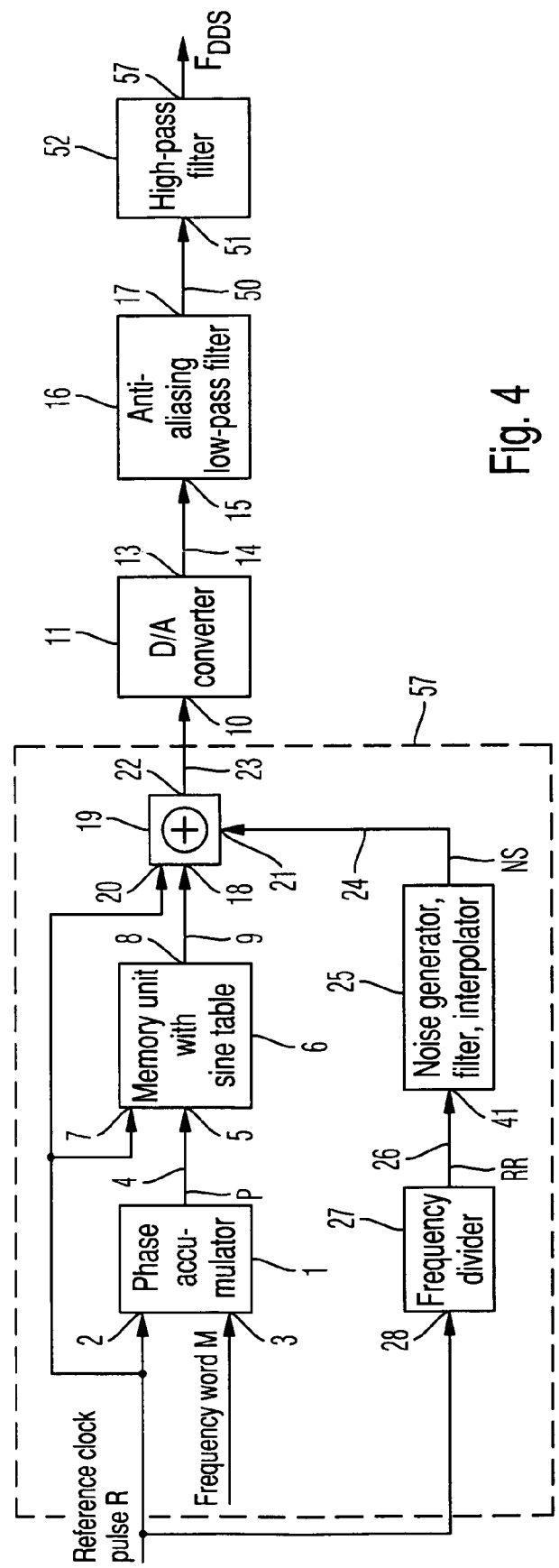
FIG. 4 shows a circuit diagram of a direct digital frequency synthesiser according to an embodiment of the invention.

On the basis of this direct digital frequency synthesiser according to the prior art shown in FIG. 3, FIG. 4 shows a direct digital frequency synthesiser according to the invention, wherein identical reference symbols refer to features identical to those indicated in FIG. 3.

The sequence of time-discrete sine-function values generated by the memory unit 6 at its output 8 is supplied via a connecting line 9 to an input 18 of an adder 19. In the adder 19, a noise signal present at the input 21 is superimposed over the sequence of time-discrete sine-function values present at the input 20 with the clock pulse of a reference clock pulse R. The sequence of time-discrete sine-function values, over which a noise signal NS is superimposed, is output at the output 22 of the adder 19 and supplied via the connecting line 23 to the output 10 of the digital-to-analog converter 11.

The noise signal N, which is supplied via a connecting line 24 to the input 21 of the adder 19, is generated by a noise generator 25. The following requirements are placed on the frequency spectrum of the noise signal NS:

No direct components in the noise signal NS, in order to avoid an undesired offset of the discrete frequency signal composed of time-discrete noise signal and time-discrete sine-function values at the output of the adder, As low a noise level as possible in the useful signal in order to achieve a good signal-noise margin and As low a noise level as possible in the lowest frequency range, in order to avoid intermodulations between lowest-frequency noise signal components and the carrier frequency thereby preventing an undesired formation of secondary lines close to the carrier in the frequency spectrum.

Since the noise signal NS is a sampled signal, periodic repetitions of the frequency spectrum in the first Nyquist zone appear in the frequency spectrum of the noise signal NS above the Nyquist threshold ($0.5*f_S$). Since the sampling frequency $f_S$ of the noise signal–25 MHz in our example— falls into the range of the useful signal (between 16 and 28 MHz), the spectral components of the noise signal at the edges of the first Nyquist zone (for example at 1 MHz or at 24 MHz) must in particular be attenuated. A digital filter is used for this purpose, which additionally increases the sampling frequency $f_S$ (up-sampling) of the noise signal by means of interpolation by the factor 2, 4, 8 etc. Higher frequency spectral components in the noise signal resulting from the periodicities in the frequency spectrum are filtered through the anti-aliasing low-pass filter 16 downstream of the digital-to-analog converter 11 in order to ensure that the structure of the digital filter is not excessively complex.

Figure 5:
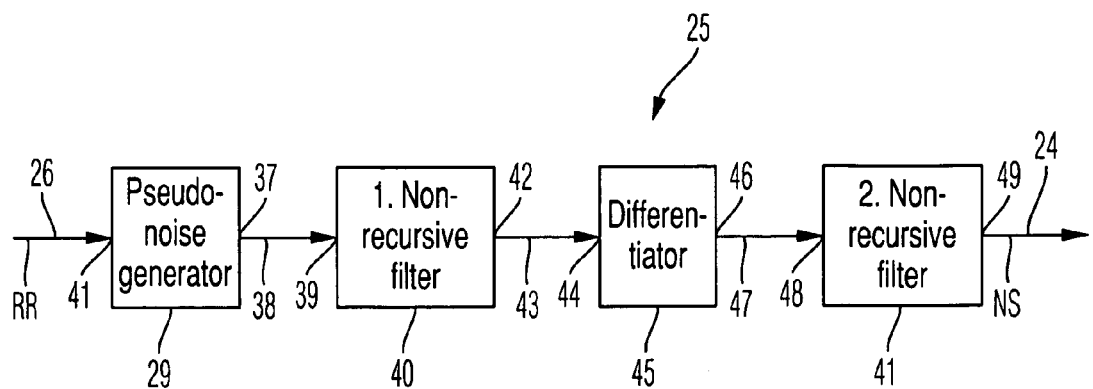
FIG. 5 shows a circuit diagram of a noise generator, which can be used according to an embodiment of the invention.

In the noise generator according to the invention as shown in FIG. 5, the interpolation of the time-discrete noise signal to a higher sampling frequency (up-sampling) is realized within a digital-filter structure at the same time as the spectral formation of the noise signal in accordance with the three requirements named above. Since the requirements for the frequency spectrum of the noise signal are comparatively complex, this task is distributed between two digital filters in the noise generator according to the invention. In each of the two digital filters, the noise signal is interpolated to double the sampling frequency in each case.

In order to supply a noise signal NS to the time-discrete sine-function values in the adder 19 meaningfully at the same sampling frequency with the clock pulse of the reference frequency R, a timing of the noise generator 25 with a frequency reduced four times by comparison with the reference frequency R is required as a result of the multiplication by four of the frequency of the noise signal in the noise generator 25. This timing frequency RR of the noise generator 25 reduced four times by comparison with the reference frequency R is generated by a frequency divider 27, at the input 28 of which the reference signal R is present. The timing frequency RR of the noise generator 25, reduced four times by comparison with the reference frequency RR, is supplied by the frequency divider 27 via the connecting line 26 to the noise generator 25.

The noise generator 25 according to FIG. 5 consists of a pseudo-noise generator 29. This is generally a closed-loop shift register, which is supplied by the timing signal RR, for example, reduced four times by comparison with the reference clock pulse R at the input 41. As a result of the closed loop of the shift register, an endless sequence of discrete sampling values, of which the signal levels are distributed quasi stochastically, but which provide a periodicity, is produced at the output of the shift register.

Figure 6:
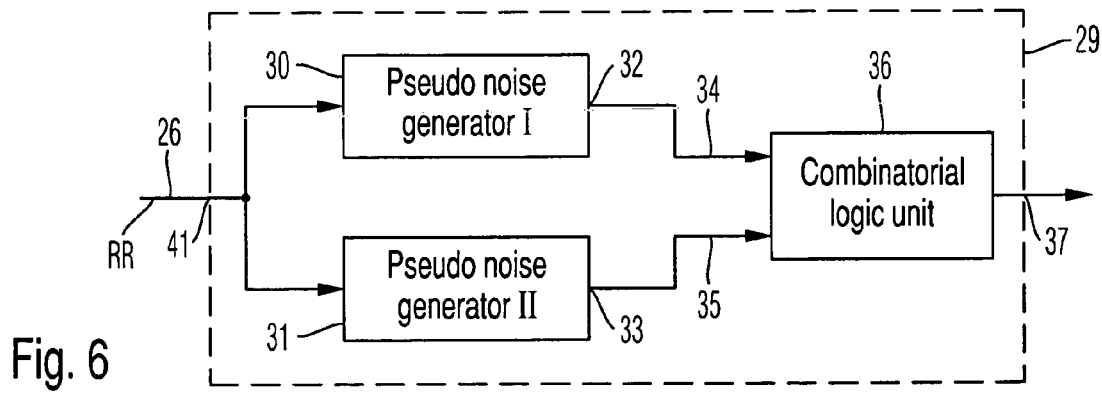
FIG. 6 shows a detail of the circuit diagram for the pseudo-noise generator in FIG. 5.

In order to prolong this periodicity of the discrete sampling values, the pseudo-noise generator 29 according to FIG. 6 preferably consists of a parallel circuit of a first pseudo-noise generator 30 and a second pseudo-noise generator 31, both of which are supplied via the connecting line 26 at the input 41 by the timing frequency RR, reduced four times by comparison with the reference frequency R. Their outputs 32 and 33 are connected via the connecting lines 34 and 35 to the combinatorial logic unit 36. The combinatorial logic unit 36 combines the two noise signals of the pseudo-noise generator 30 and 31, both of which are subjected to a periodicity, according to a combinatorial connecting logic. In this manner, a noise signal, of which the periodicity interval is significantly longer by comparison with the periodicity intervals of the first and second pseudo-noise generator 30 and 31 occurs at the output 37 of the pseudo-noise generator 29.

Figure 7:
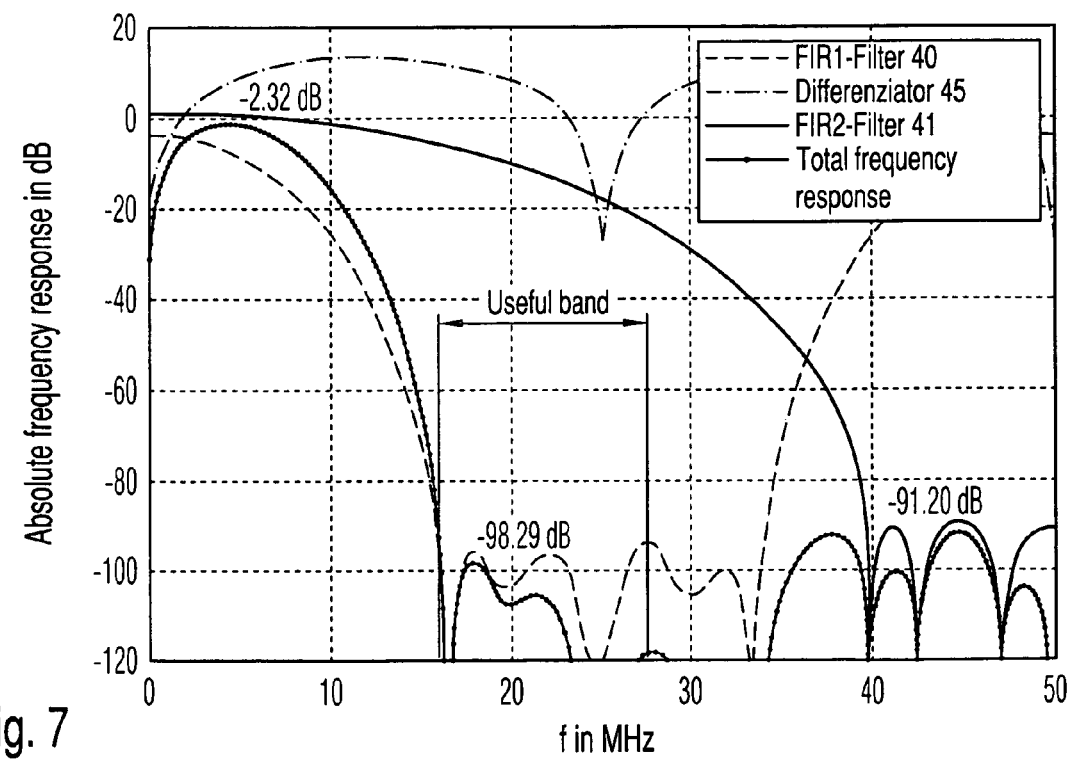
FIG. 7 shows a graphic representation of the frequency spectrum of a noise generator, which can be used according to an embodiment of the invention.

This noise signal is supplied via the connecting line 38 to the input 39 of a first non-recursive filter 40. In the first non-recursive filter 40, the frequency of the noise signal, reduced in its frequency by a factor of four by comparison with the reference frequency R, is increased by a factor of two by means of interpolation. Alongside a frequency doubling of the noise signal by means of interpolation, the first non-recursive filter 40 in combination with the second non-recursive filter 41 implements a filtering of the noise signal in accordance with the above-named three requirements for the frequency spectrum of the noise signal. As shown in FIG. 7, the frequency spectrum of the first non-recursive filter (FIR1-filter) 40 provides, a band-stop-like frequency characteristic (dotted line), which has a strongly attenuated transmission behaviour, especially in the range of the useful signal band—frequency range, for example, between 17 MHz and 28 MHz.

At the output 42 of the first non-recursive filter 40, a noise signal with half the reference frequency is present as a result of the interpolation. This is supplied via the connecting line 43 to the input 44 of a differentiator 45. In the differentiator 45, the direct component and the lowest-frequency frequency components in the noise signal are suppressed via a simple (or multiple) differentiation of the time-discrete noise signal. The frequency response of the differentiator 45 is shown in FIG. 7 (broken line) and provides significantly marked attenuation maxima not only in the lowest-frequency range but also in the range of the useful signal band at approximately 25 MHz.

The noise signal, substantially differentiated by the differentiator 45, is output at the output 46 of the differentiator 45 and supplied via a connecting line 47 to the input 48 of the second non-recursive filter 41. In the second non-recursive filter 41, the sampling frequency of the noise signal, reduced twofold in its frequency, is raised by means of interpolation by a factor of two, so that a noise signal, of which the frequency corresponds to the reference frequency R, is present at the output 49 of the second non-recursive filter 41. FIG. 7 shows the frequency response of the second non-recursive filter (FIR-2-filter) 41 (continuous line), which provides essentially a low-pass filter characteristic.

The combination of the frequency responses of the first non-recursive filter 40, the differentiator 45 and the second non-recursive filter 41 leads to the overall frequency response (continuous line with discrete points) of the digital filter structure downstream of the pseudo-noise generator 29. The clear attenuation characteristic in the frequency origin and in the lowest-frequency range is evident. Alongside this, in the frequency range up to the useful signal, the band-pass behaviour of the entire filter structure for the generation of a lower-frequency noise spectrum is clearly visible. In the region of the useful signal band, an attenuation behaviour realized simultaneously and comparatively uniformly over the entire useful signal band by all three digital filters 40, 41 and 45 takes place in order to achieve an optimum signal-noise margin. Finally, in the high-frequency range and/or the highest-frequency range above the useful signal band, an adequate attenuation behaviour for the removal of the frequency components of the noise signal above the Nyquist threshold is recognizable.

In the direct digital frequency synthesiser according to the invention, as shown in FIG. 4, the smoothed output frequency signal present at the output 17 of the anti-aliasing low-pass filter 16 is supplied via the connecting line 58 to the input 51 of an analog high-pass filter 52. In this analog high-pass filter 52, the noisy output frequency signal is separated from the lower frequency noise signal.

Figure 8:
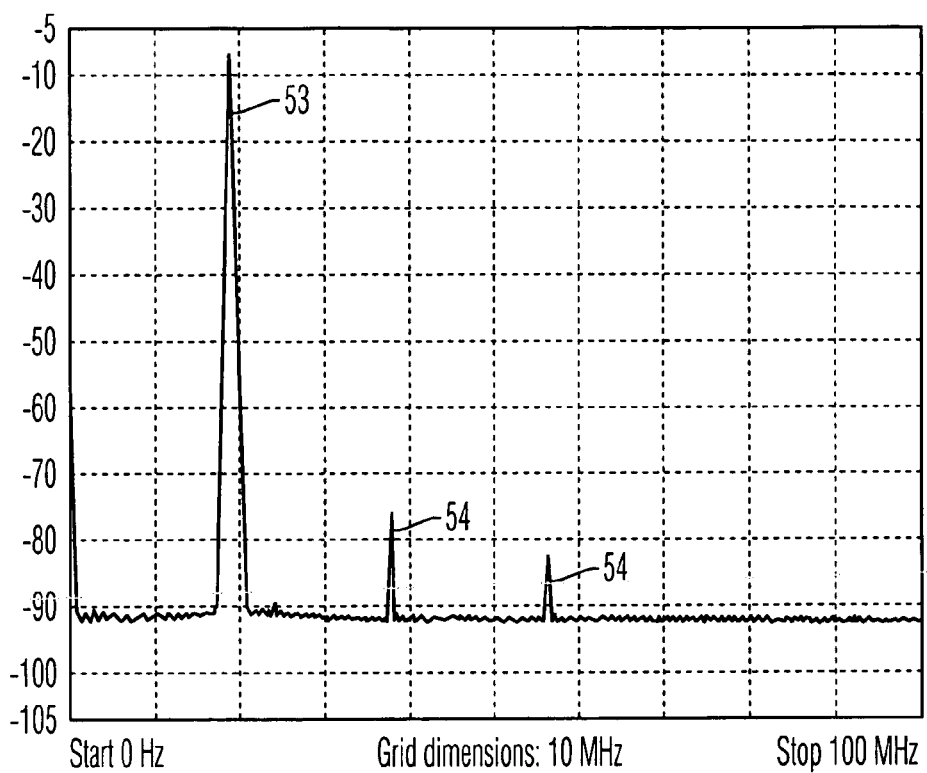
FIG. 8 shows a graphic representation of an output signal of a direct digital frequency synthesiser according to the prior art.

FIG. 8 shows the frequency spectrum of the output frequency signal of the direct digital frequency synthesiser according to the prior art, which is present at the output 17 of the anti-aliasing low-pass filter 16. The useful level 53 of the output frequency signal $F_{DDS}$, which is generated by the direct digital frequency synthesiser at a reference frequency R of 100 MHz can be seen at a frequency of 19 MHz. In the graphic representation of FIG. 8, the secondary lines 54 at the frequencies 38 MHz and 57 MHz determined by the nonlinearities of the transmission characteristic and by non-optimum dynamic behaviour of the digital-to-analog converter 11 are clearly visible. The secondary line spacing in each case is −70 dBc and −78 dBc.

Figure 9:
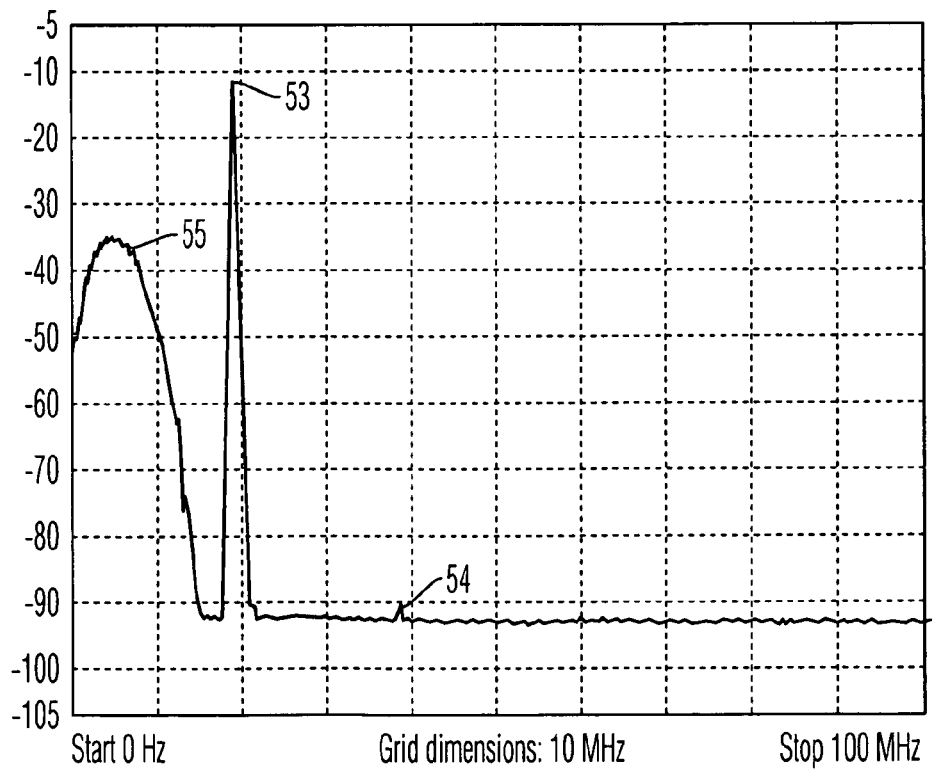
FIG. 9 shows a graphic representation of an output signal of a direct digital frequency synthesiser according to an embodiment of the invention.

FIG. 9 shows, by contrast, the frequency spectrum of the output signal $F_{DDS}$ of the discrete digital frequency synthesiser according to the invention, which is present at the output 17 of the anti-aliasing low-pass filter 16. In the illustrated example, the signal level composed of time-discrete sine-function values and time-discrete noise signal NS at the output 22 of the adder 19 is reduced by an adjustable factor of two. The useful level 53 of the output frequency signal $F_{DDS}$ of the direct digital frequency synthesiser according to the invention in FIG. 9 is therefore reduced by 6 dB by comparison with the useful level 53 of the output frequency signal $F_{DDS}$ of the direct digital frequency synthesiser according to the prior art shown in FIG. 8. This circumstance also impairs the signal-noise margin of the output frequency signal $F_{DDS}$ consistently by 6 dB. FIG. 9 shows the clear weakening of the secondary lines. (The secondary line 54 of the output frequency signal $F_{DDS}$ of the discrete digital frequency synthesiser according to the invention at the frequency 38 MHz provides a secondary line spacing of −78 dBc, the secondary lines 54 at the frequency 55 MHz provide a secondary line spacing <−80 dBc).

FIG. 9 also shows the lower-frequency noise signal component 55 in the frequency range between 0 MHz and approximately 15 MHz, which is subsequently suppressed by the analog high-pass filter 52. Residual noise components in the output frequency signal $F_{DDS}$ after filtering by the analog high-pass filter 52 are attenuated by a subsequent phase-locking loop 56 as shown in FIG. 10.

Figure 10:
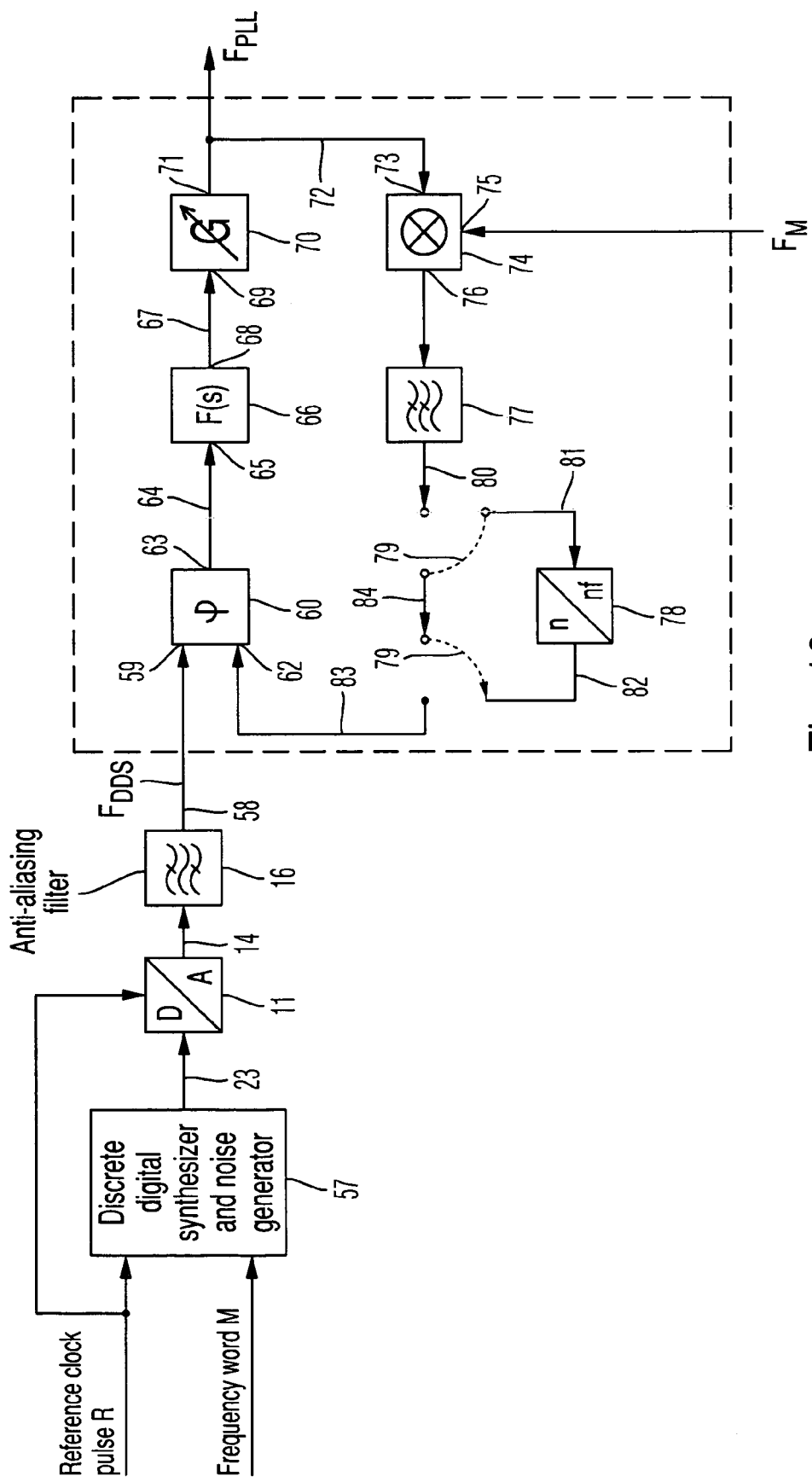
FIG. 10 shows a frequency synthesiser according to the invention consisting of a direct digital frequency synthesiser with phase-locking loop according to an embodiment of the invention connected downstream.

The overview of a frequency synthesiser presented in FIG. 10 shows a direct digital frequency synthesiser according to the invention and a subsequent phase-locking loop 56. The direct digital frequency synthesiser consists, as shown in FIG. 4, of a unit 57 according to the invention, which comprises a phase accumulator 1, the memory unit with sine table 6, the adder 19, the frequency divider 27 and the noise generator 25, a subsequent digital-to-analog converter 11, an anti-aliasing low-pass filter 16 and an analog high-pass filter 52, which is not illustrated in FIG. 10.

The phase-locking loop 56 is responsible for transforming the output frequency signal $F_{DDS}$ of the direct digital frequency synthesiser according to the invention at the output 57 of the analog high-pass filter 52—within the range, for example, between approximately 17 MHz and 28 MHz—to a high-frequency signal—within the range, for example, between 900 MHz and 1.8 GHz. For this purpose, the output frequency signal $F_{DDS}$ is supplied as a reference signal via the connecting line 58 to the first input 59 of a phase detector 60. The closed-loop and possibly frequency-divided output frequency signal $F_{PLL}$ of the phase-locking loop 56 is fed back at the second input 62 of the phase detector 60.

The system deviation consisting of the output frequency signal $F_{DDS}$ of the direct digital frequency synthesiser used as the reference signal and the closed-loop and frequency-divided output frequency signal $F_{PLL}$ of the phase-locking loop 56 is formed in the phase detector 60. This system deviation at the output 63 of the phase detector 60 is supplied via the connecting line 64 to the input 65 of the control filter 66. In the control filter 66, a dynamic evaluation of the system deviation takes place in order to achieve an optimum dynamic and stationary control behaviour of the phase-locking loop 56 (lowest possible transient recovery time, minimised overshooting, minimum stationary system deviation etc.). In this manner, the output frequency signal $F_{PLL}$ of the phase-locking loop 56 is fed back in an optimum manner to the output frequency signal $F_{PLL}$ of the direct digital frequency synthesiser used as the reference parameter for frequency-difference formation.

The output control parameter present at the output 68 of the control filters 66 is supplied via the connecting line 67 to the input of the voltage-controlled frequency oscillator 70. On the basis of the output control parameter, the voltage-controlled frequency oscillator 70 generates the corresponding high-frequency output frequency signal $F_{PLL}$ at the output 71.

The output frequency signal $F_{PLL}$ present at the output 71 of the voltage-controlled frequency oscillator 70 is supplied via the connecting line 72 to the first input 73 of the mixer 74. At the second input 75 of the mixer 74, a spectrally very pure mixed-frequency signal $F_M$ is present, which is in the same order of magnitude as the output frequency signal $F_{PLL}$ and can only be adjusted within a coarse frequency grid. The mixer 74 generates a frequency signal at its output 76, which corresponds to the difference between the output frequency signal $F_{PLL}$ of the phase-locking loop 56 and the coarse-grid mixed-frequency signal $F_M$ present at the carrier signal input 75. In this manner, the frequency of the output frequency signal $F_{PLL}$ of the phase-locking loop 56 is reduced by analogy with a phase-locking loop with frequency divider with a closed-loop branch, but without the frequency division of the output frequency signal by the factor N required in this context, which, as explained above, leads to a significant increase in the phase noise at the output of the phase-locking loop.

The further frequency signal also generated by the mixer 74 at its output 76, which corresponds to the sum of the output frequency signal $F_{PLL}$ of the phase-locking loop 56 and the coarse-grid mixed-frequency signal $F_M$ present at the second input 75, is suppressed by a low-pass filter 77 following the mixer 74.

The coarse-grid, spectrally very pure mixed-frequency signal $F_M$ at the second input 75 of the mixer 74 is generated either from a spectrally very pure fixed frequency via a frequency multiplier or using a second phase-locking loop.

The output frequency signal $F_{PLL}$ of the phase-locking loop 56 converted via the mixer 74 is supplied, after a low-pass filtering by means of low-pass filter 77, via the connecting lines 80 and 81 and via a switch 79 in the switch position connecting the connecting lines 80 and 81, to a frequency divider 78. This frequency divider 78, which can be used optionally, then only implements a frequency division of the output frequency signal $F_{PLL}$ already converted by the mixer 74 on a small scale. When using the frequency divider 78, the conversion of the output frequency signal $F_{PLL}$ of the phase-locking loop can be designed more coarsely in accordance with the division factor of the frequency divider 78.

The frequency-divided output signal of the frequency divider 78 is supplied to the second input 62 of the phase detector 60 via the connecting lines 82 and 83 and the switch 79 in the switching position connecting the connecting lines 82 and 83 to one another. By contrast, if the switch is held in the other switching position, the frequency-reduced output signal of the mixer 74 is supplied, after a low-pass filtering by means of low-pass filter 77, without frequency division by the frequency divider 78, via the connecting line 88, the direct connection 84 and the connecting line 83, to the second input 62 of the phase detector 60.

Figure 11:
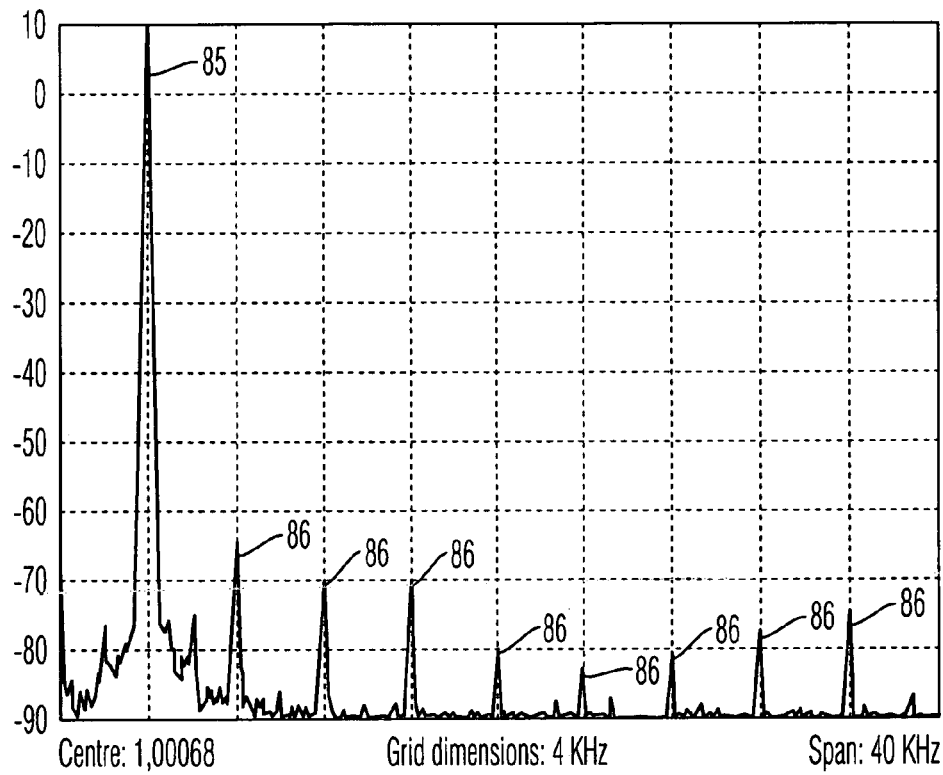
FIG. 11 shows a graphic representation of an output signal of a frequency synthesiser, consisting of a direct digital frequency synthesiser according to the prior art with phase-locking loop connected downstream.

FIG. 11 shows the output frequency signal $F_{PLL}$ of the phase-locking loop 56 with direct digital frequency synthesiser according to the prior art connected upstream without superimposition of a discrete noise signal NS over the discrete sine-function values. The output frequency signal $F_{DDS}$ of the direct digital frequency synthesiser is adjusted by a timing of the direct digital frequency synthesiser with a reference frequency of 100 MHz in the illustrated example to the frequency of 16.666 MHz. With a supply of a mixed-frequency signal $F_M$ of 934 MHz at the carrier signal input 75 of the modulator 74 and a frequency division at the frequency divider 78 by the factor 4, an output frequency signal $F_{PLL}$ of the phase-locking loop 56 of 1.000664 GHz (934 MHz+4*16.666 MHz=1.000664 GHz) is obtained.

The useful level 85 of this output frequency signal $F_{PLL}$ of the phase-locking loop 56 is clearly illustrated in FIG. 11 at the frequency 1.000664 GHz. FIG. 11 also clearly illustrates the secondary lines 86, which occur close to the carrier at the useful level 85 with frequencies 1.000664 GHz+k*4 kHz (k=1, 2, 3, 4, 5 etc.) as a result of nonlinearities present in the transmission characteristic and non-ideal dynamic relationships in the digital-to-analog converter 11. The corresponding secondary line spacings are respectively −75 dBc, −82 dBc, −83, −95 dBc −90 dBc, −93 dBc −89 dBc and −87 dBc.

The secondary lines 86 in the frequency spectrum of the output frequency signal $F_{PLL}$ of the phase-locking loop 56 are very close to the carrier at the frequency of the useful signal level (|f|<1.000664 GHz+50 kHz). After the formation of the system deviation in the phase detector 60, the frequencies of the secondary lines at the input 65 of the control filter 66 are disposed in a frequency range smaller than 50 kHz and are not suppressed by the control dynamics of the control filter 65, which essentially determines the control dynamics of the open phase-locking loop 56—the amplitude and/or phase throughput frequency of the open phase-locking loop 56 is within the order of magnitude of 500 kHz.

Figure 12:
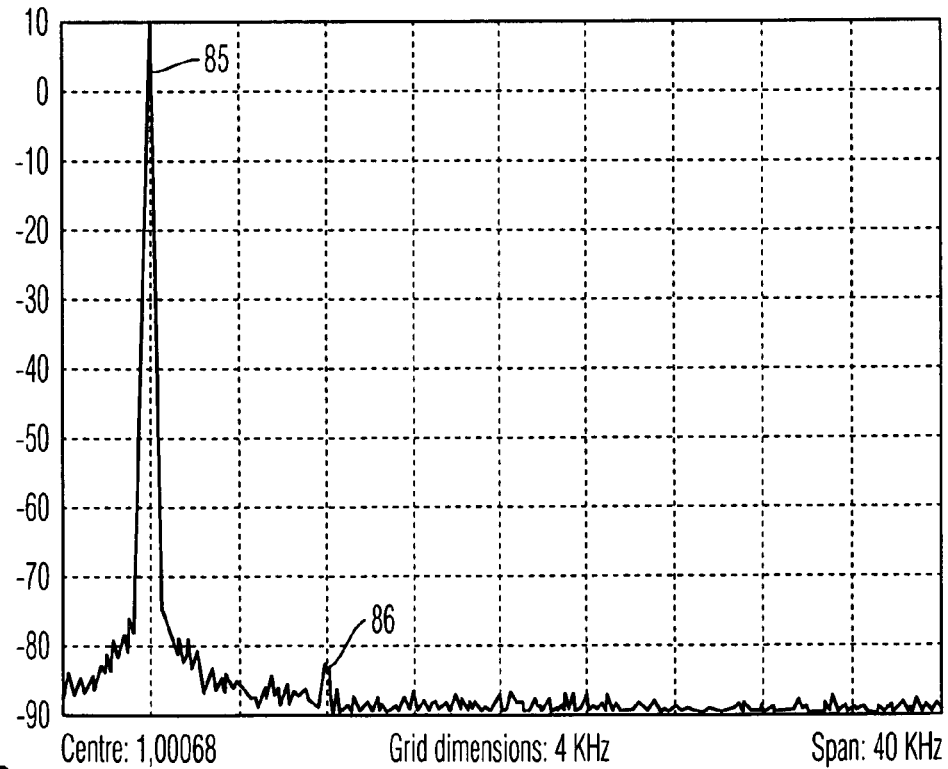
FIG. 12 shows a graphic representation of an output signal of a frequency synthesiser, consisting of a frequency synthesiser according to an embodiment of the invention with phase-locking loop connected downstream.

By contrast, FIG. 12 shows the output frequency signal $F_{PLL}$ of the phase-locking loop 56 with direct digital frequency synthesiser according to the invention connected upstream. The useful signal level 85 is shown at a frequency of 1.000664 GHz. The secondary lines are suppressed comparatively well. The secondary line 86 at the frequency 1.000664 GHz+8 kHz is still easily recognizable in the spectrum. Its secondary-line spacing is −93 dBc. Because of the frequency division by the factor 4 in the phase-locking loop 56, a secondary line spacing of −105 dBc is obtained for this secondary line with reference to the output frequency $F_{DDS}$ of the direct digital frequency synthesiser according to the invention. The remaining secondary lines all provide a secondary-line spacing >−100 dBc, which has not hitherto been realized with other direct digital frequency synthesisers with phase-locking loop connected downstream.

The invention is not restricted to the exemplary embodiments illustrated. All of the features of the exemplary embodiments can be combined with one another as desired.

The invention claimed is:

1. A frequency synthesiser according to a direct digital synthesis method comprising a phase accumulator for cyclical incrementation of a phase signal by a phase increment present at an input of the phase accumulator, with a memory unit containing a table of sine-function values stored in memory cells of the memory unit for determination of sine-function values corresponding to phase values of the phase signal, with a digital-to-analog converter for conversion of the time-discrete sine-function values into a quasi-analog sinusoidal time function and with an anti-aliasing low-pass filter for smoothing the quasi- analog sinusoidal time function, and with a frequency divider, wherein
    a non-periodic signal is superimposed over the time-discrete sinusoidal function values in an adder, which is connected between the memory unit and the digital-to-analog converters
    wherein a noise signal bandpass-filtered by a bandpass filter in a low-frequency range is generated by a noise generator, which is controlled with a frequency-divided reference clock pulse obtained from dividing a common reference clock pulse by the frequency divider, and wherein the common reference clock pulse is provided by a common reference clock generator with a common reference frequency.

2. The frequency synthesiser according to claim 1, wherein the non-periodic signal is a noise signal.

3. The frequency synthesiser according to claim 2, wherein the non-periodic signal is a noise signal low-pass filtered in the low-frequency range.

4. The frequency synthesiser according to claim 1, wherein the frequency-divided reference clock pulse has a frequency which is reduced multiple times by comparison with the common reference clock pulse.

5. The frequency synthesiser according to claim 4, wherein the noise generator includes:
    a pseudo-noise generator for generating a noise signal with a clock-pulse frequency which is reduced multiple times by comparison with the common reference clock pulse;
    a first non-recursive filter for interpolating the noise signal generated by the pseudo-noise generator to a noise signal with a clock-pulse frequency which is reduced multiple times by comparison with the common reference signal;
    a differentiator for filtering a direct component and low-frequency components out of the noise signal generated by the first non-recursive filter; and
    a second non-recursive filter for interpolating the noise signal generated by the differentiator to a noise signal with a clock-pulse frequency corresponding to the common reference frequency.

6. The frequency synthesiser according to claim 5, wherein the frequency of the frequency-divided reference clock pulse and the frequency limiting of the noise signal generated by the pseudo-noise generator are reduced four times by comparison with the common reference frequency, and the frequency limiting of the noise signal generated by the first non- recursive filter is reduced twice by comparison with the common reference frequency.

7. The frequency synthesiser according to claim 5, wherein the pseudo-noise generator includes two parallel-connected pseudo-noise generators, of which the outputs are interconnected via a combinatorial logic unit.

8. The frequency synthesiser according to claim 3, wherein the anti-aliasing low-pass filter is followed by an analog high-pass filter for suppression of the noise signal bandpass-filtered in the low-frequency range in an output signal of the anti-aliasing low-pass filter.

9. The frequency synthesiser according to claim 8, wherein an output of the analog high-pass filter is supplied to a first input of a phase-locking loop.

10. The frequency synthesiser according to claim 9, wherein the phase-locking loop includes:
  a phase detector for determining system deviation between an output frequency signal of the frequency synthesiser present at the output of the analog high-pass filter and a frequency-divided output frequency signal of the phase-locking loop;
  a control, filter for dynamic evaluation of the system deviation present at the output of the phase detector;
  a voltage-controlled frequency oscillator for generating an output frequency signal dependent upon an output signal of the control filter; and
  a mixer and a series-connected low-pass filter for coarse conversion of the output frequency signal by a value of a coarse-grid mixed-frequency signal present in the mixer.

11. The frequency synthesiser according to claim 10, wherein the frequency divider for frequency division of the output frequency signal coarsely converted by the mixer, across which the frequency divider can be bridged via a direct connection, is connected to downstream of the mixer.

12. The frequency synthesiser according to claim 10, wherein the coarse-grid mixed-frequency signal supplied to the mixer of the phase-locking loop is generated by one of a second phase-locking loop and conversion from the common reference frequency.

* * * * *